(12) United States Patent
Tanaka et al.

(10) Patent No.: US 10,171,036 B2
(45) Date of Patent: Jan. 1, 2019

(54) POWER AMPLIFICATION CIRCUIT

(71) Applicant: Murata Manufacturing Co., Ltd., Kyoto (JP)

(72) Inventors: Satoshi Tanaka, Kyoto (JP); Tetsuaki Adachi, Kyoto (JP); Kazuo Watanabe, Kyoto (JP); Masahito Numanami, Kyoto (JP); Yasuhisa Yamamoto, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/656,646

(22) Filed: Jul. 21, 2017

(65) Prior Publication Data

US 2018/0062579 A1 Mar. 1, 2018

(30) Foreign Application Priority Data

Aug. 25, 2016 (JP) ................................. 2016-164596

(51) Int. Cl.
| | |
|---|---|
| *H03K 5/22* | (2006.01) |
| *H03F 1/02* | (2006.01) |
| *H03F 1/56* | (2006.01) |
| *H03F 3/193* | (2006.01) |
| *H03F 3/21* | (2006.01) |
| *H03F 3/191* | (2006.01) |

(52) U.S. Cl.
CPC ......... *H03F 1/0205* (2013.01); *H03F 1/0261* (2013.01); *H03F 1/56* (2013.01); *H03F 3/191* (2013.01); *H03F 3/193* (2013.01); *H03F 3/21* (2013.01); *H03F 2200/18* (2013.01); *H03F 2200/222* (2013.01); *H03F 2200/387* (2013.01); *H03F 2200/451* (2013.01); *H03F 2200/75* (2013.01)

(58) Field of Classification Search
None
See application file for complete search history.

(56) References Cited

U.S. PATENT DOCUMENTS

| | | | |
|---|---|---|---|
| 6,417,735 B1 | 7/2002 | Luo | |
| 7,439,808 B2 * | 10/2008 | Inamori | H03F 1/30 330/289 |

(Continued)

FOREIGN PATENT DOCUMENTS

| | | |
|---|---|---|
| JP | 2007-329831 A | 12/2007 |
| JP | 2009-165100 A | 7/2009 |

OTHER PUBLICATIONS

Satoshi Tanaka, "Evolution of Power Amplifier for mobile applications" International Meeting for Future of Electron Devices, Kansai (IMFEDK), IEEE 2013.

*Primary Examiner* — Long Nguyen
(74) *Attorney, Agent, or Firm* — Pearne & Gordon LLP

(57) ABSTRACT

Provided is a power amplification circuit that includes: an amplifier that amplifies an input signal and outputs an amplified signal; a first bias circuit that supplies a first bias current or voltage to the amplifier; a second bias circuit that supplies a second bias current or voltage to the amplifier; a first control circuit that controls the first bias current or voltage; and a second control circuit that controls the second bias current or voltage. The current supplying capacity of the first bias circuit is different from the current supplying capacity of the second bias circuit.

14 Claims, 9 Drawing Sheets

(56) References Cited

U.S. PATENT DOCUMENTS

2007/0222520 A1* 9/2007 Inamori ................ H03F 1/30
330/289
2008/0001675 A1 1/2008 Kazi
2015/0349715 A1* 12/2015 Gerard .................. H03F 1/56
330/296

* cited by examiner

POWER AMPLIFICATION CIRCUIT

This application claims priority from Japanese Patent Application No. 2016-164596 filed on Aug. 25, 2016. The content of this application is incorporated herein by reference in its entirety.

BACKGROUND

The present disclosure relates to power amplification circuits. A power amplification circuit is used in a mobile communication device such as a cellular phone in order to amplify the power of a radio frequency (RF) signal to be transmitted to a base station. A bias circuit is used in such a power amplification circuit to supply a bias voltage or bias current to an amplifier. For example, an emitter-follower bias circuit in which a heterojunction bipolar transistor is used is disclosed in "Evolution of Power Amplifier for mobile applications" Satoshi Tanaka, International Meeting for Future of Electron Devices, Kansai (IMFEDK), 2013 IEEE, pp 112-113.

In a power amplification circuit, a bias current may increase and the output current of an amplifier may increase as the input power increases. The output characteristic of such an amplifier changes depending on the characteristics of the bias circuit (output impedance etc. of bias circuit, for example). Regarding this point, in the configuration disclosed in the above-cited document, since the characteristics of the bias circuit are fixed, the output characteristic of the amplifier is also fixed. Therefore, in the configuration disclosed in the above-cited document, the output characteristic of the amplifier cannot be freely adjusted.

BRIEF SUMMARY

The present disclosure was made in light of the above-described circumstances, and the present disclosure provides a power amplification circuit that can adjust the output characteristic of an amplifier thereof.

A power amplification circuit according to an embodiment of the present disclosure includes: an amplifier that amplifies an input signal and outputs an amplified signal; a first bias circuit that supplies a first bias current or voltage to the amplifier; a second bias circuit that supplies a second bias current or voltage to the amplifier; a first control circuit that controls the first bias current or voltage; and a second control circuit that controls the second bias current or voltage. The current supplying capacity of the first bias circuit is different from the current supplying capacity of the second bias circuit.

According to the present disclosure, a power amplification circuit is provided that can adjust the output characteristic of an amplifier.

Other features, elements, characteristics and advantages of the present disclosure will become more apparent from the following detailed description of embodiments of the present disclosure with reference to the attached drawings.

DETAILED DESCRIPTION

Figure 1:
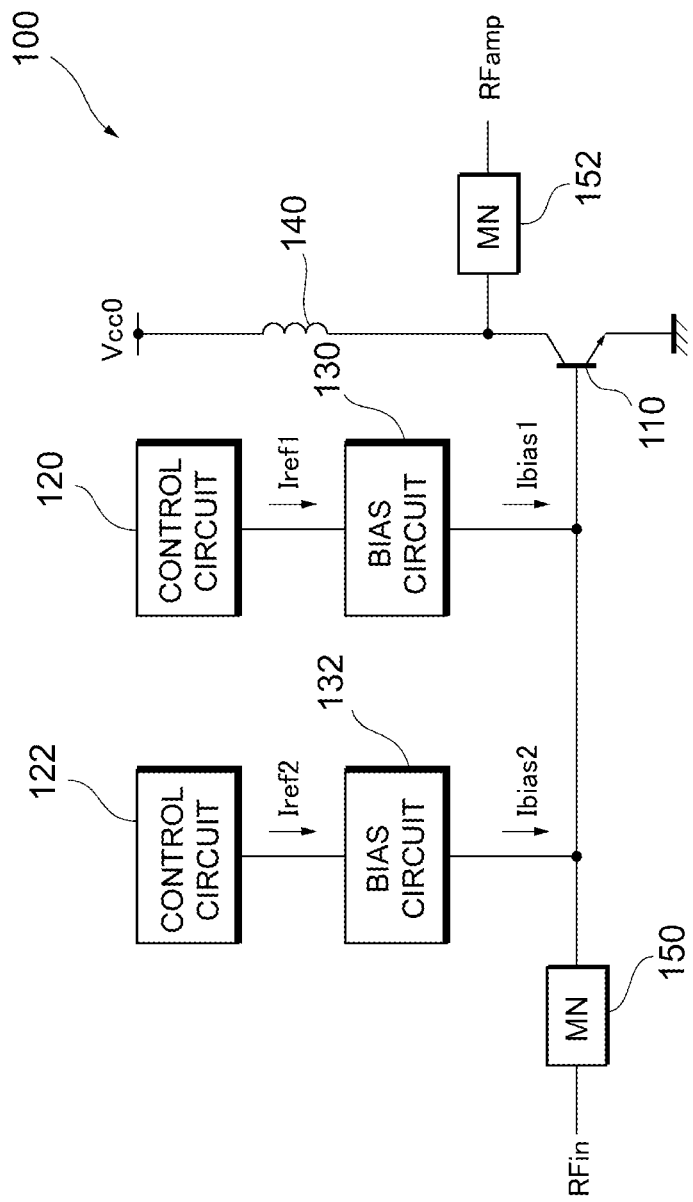
FIG. 1 illustrates the configuration of a power amplification circuit according to a first embodiment of the present disclosure.

Hereafter, embodiments of the present disclosure will be described while referring to the drawings. FIG. 1 illustrates the configuration of a power amplification circuit 100 according to a first embodiment of the present disclosure. The power amplification circuit 100 amplifies an input radio frequency (RF) signal and outputs the amplified signal in a mobile communication device such as a cellular phone, for example. The frequency of the RF signal is around several GHz, for example.

As illustrated in FIG. 1, the power amplification circuit 100 includes a transistor 110, control circuits 120 and 122, bias circuits 130 and 132, an inductor 140, and matching networks 150 and 152.

The transistor 110 (amplifier) amplifies an input signal RFin and outputs an amplified signal RFamp. A bipolar transistor such as a heterojunction bipolar transistor (HBT) may be used as the transistor, for example. Alternatively, a metal-oxide-semiconductor field effect transistor (MOSFET) may be used instead of a HBT.

A power supply voltage Vcc0 is supplied to the collector of the transistor 110 via the inductor 140, the input signal RFin is supplied to the base of transistor 110 via the matching network 150 and the transistor 110 has a common emitter. In addition, bias currents Ibias1 (first bias current) and Ibias2 (second bias current) are supplied from the bias circuits 130 and 132 to the base of the transistor 110. Thus, the amplified signal RFamp is generated as a result of the input signal RFin being amplified in accordance with the bias currents Ibias1 and Ibias2, and the amplified signal RFamp is output from the collector of the transistor 110. The number of stages of the amplifier is not limited to one and may be two or more.

The control circuits 120 (first control circuit) and 122 (second control circuit) supply reference currents Iref1 (first current) and Iref2 (second current) to the bias circuits 130 and 132, for example. The control circuits 120 and 122 adjust the sizes of the bias currents Ibias1 and Ibias2 by controlling the sizes of the reference currents Iref1 and Iref2, respectively.

The bias circuits 130 (first bias circuit) and 132 (second bias current) respectively supply the bias currents Ibias1 and Ibias2 to the base of the transistor 110 in accordance with the reference currents Iref1 and Iref2 supplied from the control circuits 120 and 122. In this embodiment, the bias circuit 130 and the bias circuit 132 have different current supplying capacities and output impedances from each other. In the present specification, the current supplying capacity of a bias circuit represents the value of the maximum current that can be output by the bias circuit. Thus, the size of the bias current (i.e., the sum of the bias currents Ibias1 and Ibias2) supplied to the base of the transistor 110 can be changed to various values by adjusting the ratio between the bias currents Ibias1 and Ibias2 supplied from the bias circuits 130 and 132, for example. The configurations of the bias circuits 130 and 132 will be described in detail later.

The inductor 140 is provided between a power supply voltage terminal and the transistor 110, and suppresses coupling between the RF signal and the power supply circuit.

The matching networks (MN) 150 and 152 are provided before and after the transistor 110. The matching networks (MN) match impedances between the preceding circuit and the transistor 110 and the subsequent circuit and the transistor 110. The matching networks 150 and 152 are formed using capacitors and inductors, for example.

Figure 2:
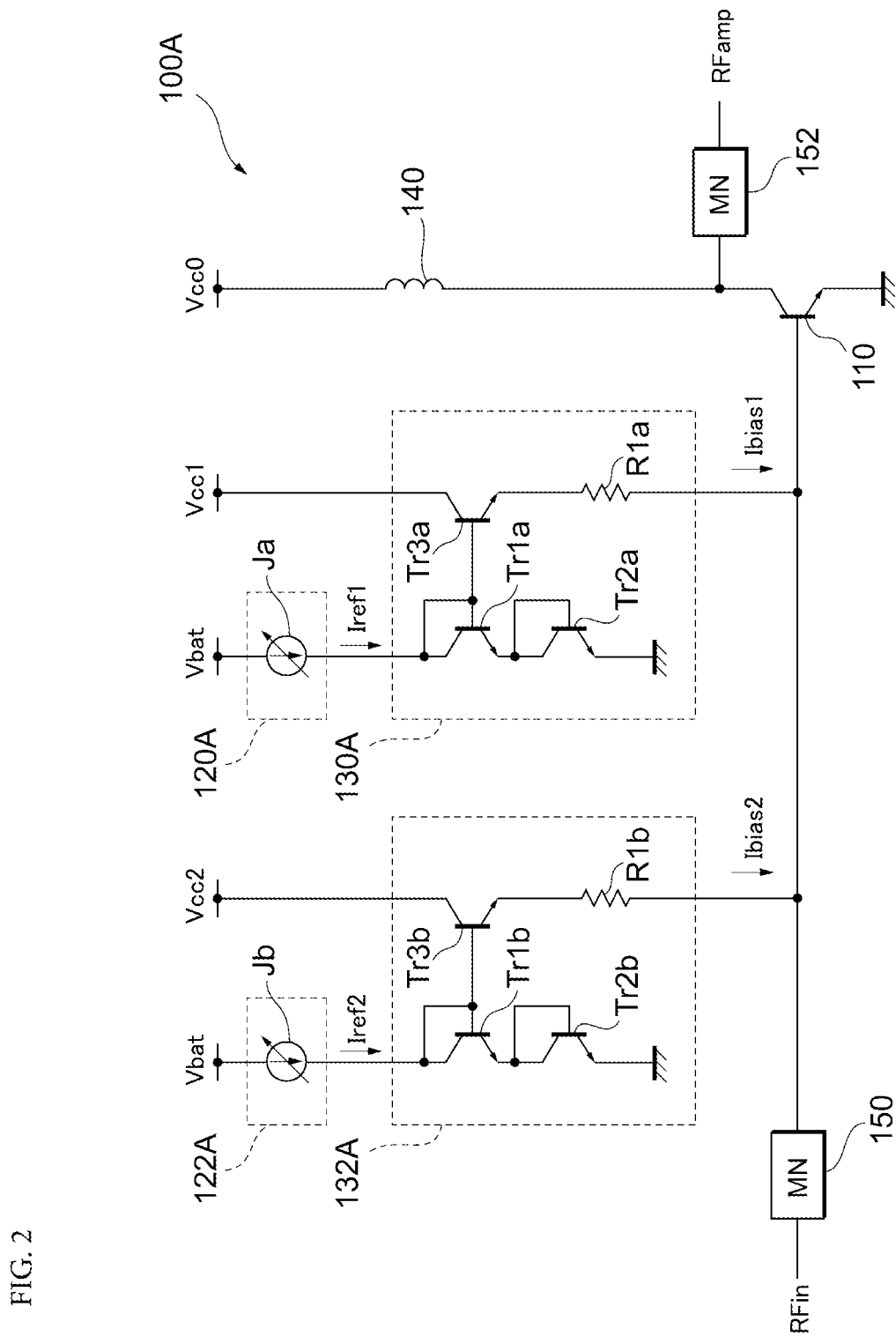
FIG. 2 illustrates an example configuration of the power amplification circuit according to the first embodiment of the present disclosure.

FIG. 2 illustrates an example configuration (power amplification circuit 100A) of the power amplification circuit 100 according to the first embodiment of the present disclosure. In the power amplification circuit 100A, specific example configurations of the control circuits 120 and 122 and the bias circuits 130 and 132 (control circuits 120A and 122A and bias circuits 130A and 132A) are illustrated.

The control circuits 120A and 122A respectively include variable current sources Ja and Jb. For example, the variable current sources Ja and Jb are each able to change the size of the current thereof in accordance with a control signal supplied from the outside. Thus, the control circuits 120A and 122A generate and output the reference currents Iref1 and Iref2 having sizes that correspond to the output power of an RF signal, for example.

The bias circuit 130A includes transistors Tr1a, Tr2a and Tr3a (first transistor) and a resistance element R1a (first resistance element), for example. Similarly, the bias circuit 132A includes transistors Tr1b, Tr2b and Tr3b (second transistor or second bipolar transistor) and a resistance element R1b (second resistance element), for example. The bias circuits 130A and 132A respectively generate the bias currents Ibias1 and Ibias2 in accordance with the sizes of the reference currents Iref1 and Iref2 output from the control circuits 120A and 122A, and supply the bias currents Ibias1 and Ibias2 to the base of the transistor 110. Since the configuration of the bias circuit 132A is the same as that of the bias circuit 130A in this embodiment, detailed description thereof is omitted.

The collector and the base of the transistor Tr1a are connected to each other (hereafter, referred to as being diode connected), the reference current Iref1 is supplied to the collector of the transistor Tr1a, the base of the transistor Tr1a is connected to the base of the transistor Tr3a and the emitter of the transistor Tr1a is connected to the collector of the transistor Tr2a. The transistor Tr2a is diode connected, the collector thereof is connected to the emitter of the transistor Tr1a, and the emitter of the transistor Tr2a is connected to ground. Thus, a voltage of a prescribed level (for example, around 2.6 V) is generated at the base of the transistor Tr1a.

A power supply voltage Vcc1 is supplied to the collector of the transistor Tr3a (first transistor), a base voltage of the transistor Tr1a is supplied to the base of the transistor Tr3a, and the emitter of the transistor Tr3a is connected to one end of the resistance element R1a. In addition, a current corresponding to the size of the reference current Iref1 is supplied to the base of the transistor Tr3a. Thus, the bias current Ibias1 is output from the emitter of the transistor Tr3a in accordance with the reference current Iref1. The method of generating the base voltage (control voltage) of the transistor Tr3a is not limited to that described above, and for example, a variable voltage that can be controlled in accordance with a control signal supplied from the outside may instead be adopted.

One end of the resistance element R1a (first resistance element) is connected to the emitter of the transistor Tr3a and the other end of the resistance element R1a is connected to the base of the transistor 110. In other words, the resistance element R1a is connected in series with the emitter of the transistor Tr3a and is connected to the base of the transistor 110.

In this embodiment, the bias circuit 130A and the bias circuit 132A are configured to have different output impedances and current supplying capacities from each other. Specifically, the current supplying capacities of the bias circuits 130A and 132A can be made different from each other by using transistors having different element sizes as the transistor Tr3a and the transistor Tr3b, by using resistance elements having different resistance values as the resistance element R1a and the resistance element R1b, or by adjusting the sizes of the reference currents Iref1 and Iref2 generated by the control circuits 120A and 122A. A larger current could be made to flow through one of the transistors even if the transistors have the same base-emitter voltage by making the emitter of one of the transistors Tr3a and Tr3b have a larger emitter surface area than the other transistor.

With the above-described configuration, the sizes of the bias currents Ibias1 and Ibias2 supplied from the bias circuits 130A and 132A are controlled in the power amplification circuit 100A. Thus, the ratio between the bias currents Ibias1 and Ibias2 constituting the bias current supplied to the base of the transistor 110 (i.e., the sum of the bias current Ibias1 and the bias current Ibias2) can be changed to various values, and the output characteristic of the amplifier can be adjusted. Although a configuration in which a bias current is adjusted has been described as an example in this embodiment, a configuration in which a bias voltage is adjusted rather than a bias current may be adopted instead.

Figure 3:
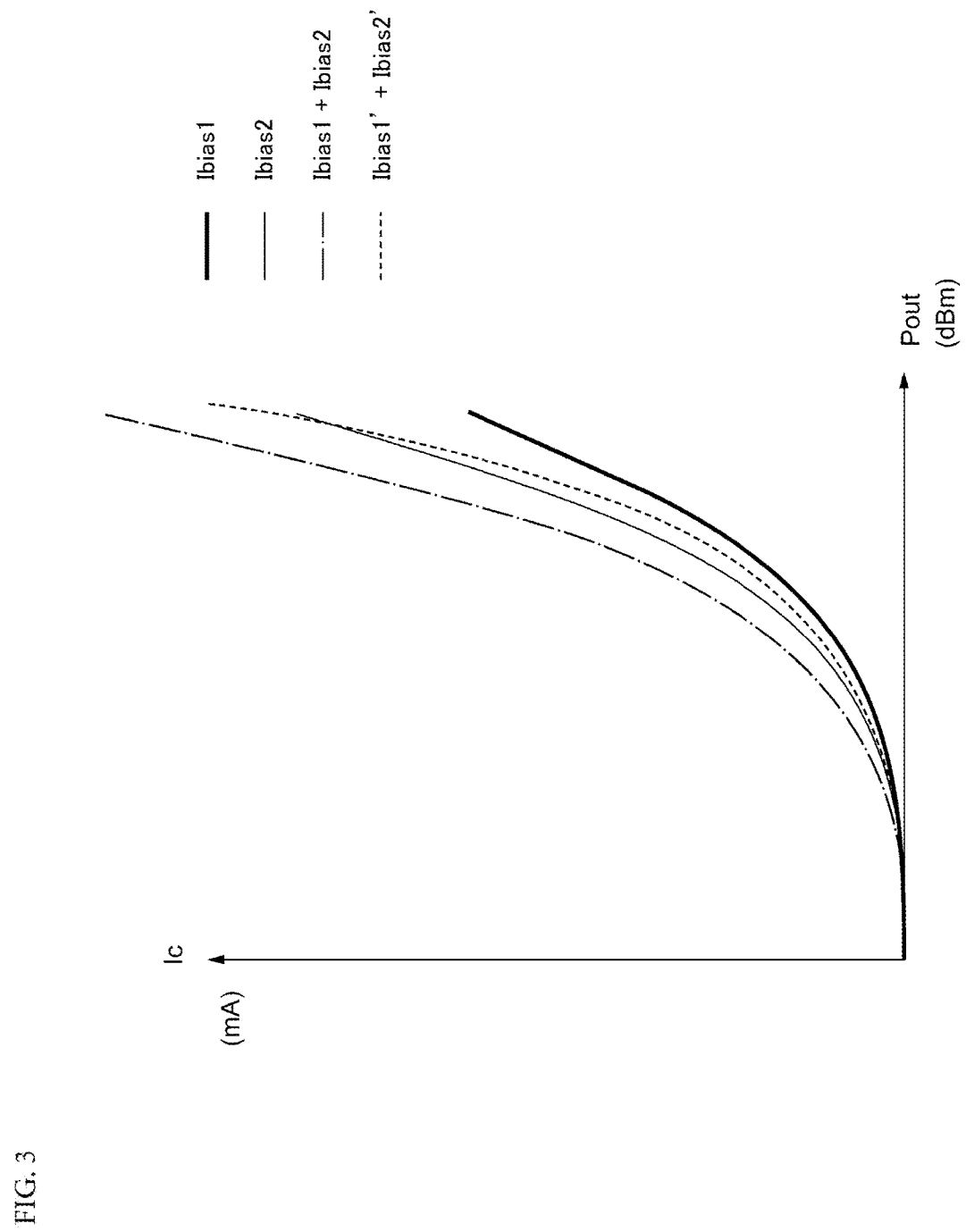
FIG. 3 is a graph illustrating an output characteristic of an amplifier of the power amplification circuit according to the first embodiment of the present disclosure.

FIG. 3 is a graph illustrating the output characteristic of the amplifier of the power amplification circuit 100 according to the first embodiment of the present disclosure. Specifically, the graph illustrates the output characteristic of the amplifier in a case where only the bias circuit 130 among the bias circuits 130 and 132 is made to operate with a maximum reference current Iref1 (Ibias1), a case where only the bias circuit 132 among the bias circuits 130 and 132 is made to operate with a maximum reference current Iref2 (Ibias2), a case where both the bias circuits 130 and 132 are made to operate with maximum reference currents Iref1 and Iref2 (Ibias1+Ibias2), and a case where the bias circuits 130 and 132 are made to operate by adjusting the reference currents Iref1 and Iref2 such that the bias currents from the bias circuits 130 and 132 are at a prescribed ratio (Ibias1'+Ibias2'). In the graph, the vertical axis represents a collector current Ic (mA) of the transistor 110 and the horizontal axis represents an output power Pout (dBm) of the RF signal.

As illustrated in FIG. 3, it is clear that different output characteristics (Ibias1+Ibias2 or Ibias1'+Ibias2') from those in the cases where only one of the bias circuits is made to operate (Ibias1 or Ibias2) can be obtained by using the bias circuits 130 and 132 together. Thus, an output characteristic can be obtained in which a curve representing the output characteristic in the case where both the bias currents Ibias1 and Ibias2 are maximally supplied (Ibias1+Ibias2) is maximized by using bias circuits having different current supplying capacities together and combining the plurality of bias currents. Specifically, for example, the weighting of Ibias1 and Ibias2 can be adjusted and a bias characteristic such as Ibias1'+Ibias2' can be realized by adjusting the values of the variable current sources Ja and Jb illustrated in FIG. 2. In the graph illustrated in FIG. 3, the gain of the amplifier is comparatively low and current consumption is comparatively small in the case of Ibias1, which is obtained by causing only the bias circuit 130 to operate. On the other hand, the slope of the graph is steeper than for Ibias1, the gain of the amplifier is comparatively high and current consumption is comparatively large in the case of Ibias2, which is obtained by causing only the bias circuit 132 to operate. Therefore, the gain and current consumption can be adjusted to desired levels by causing both the bias circuits 130 and 132 to operate and combining Ibias1 and Ibias2.

Figure 4:
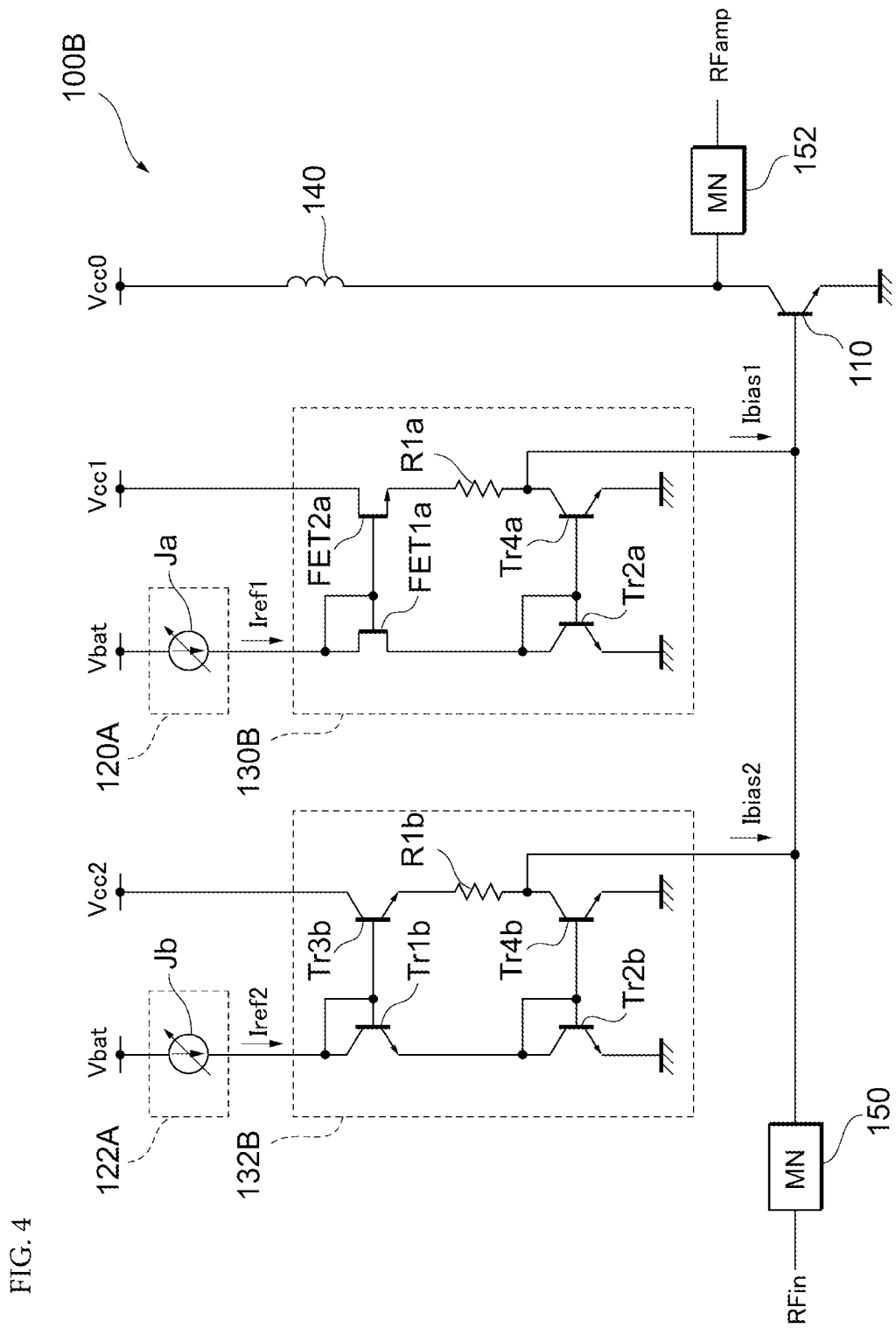
FIG. 4 illustrates an example configuration of a power amplification circuit according to a modification of the first embodiment of the present disclosure.

FIG. 4 illustrates an example configuration (power amplification circuit 100B) of a power amplification circuit 100 according to a modification of the first embodiment of the present disclosure. The power amplification circuit 100B includes bias circuits 130B and 132B instead of the bias circuits 130A and 132A illustrated in FIG. 2.

Compared with the bias circuit 130A illustrated in FIG. 2, the bias circuit 130B includes FETs (FET1a) and (FET2a) instead of the transistors Tr1a and Tr3a. In addition, the bias circuit 130B further includes a transistor Tr4a.

The drain and gate of the FET (FET1a) are connected to each other (hereafter, referred to as being diode connected), the reference current Iref1 is supplied to the drain of the FET (FET1a), the gate of the FET (FET1a) is connected to the gate of the FET (FET2a), and the source of the FET (FET1a) is connected to the collector of the transistor Tr2a. Thus, a voltage of a prescribed level (for example, around 1.6 V when the threshold value of the FET is 0.3 V) is generated at the gate of the FET (FET1a).

The power supply voltage Vcc1 is supplied to the drain of the FET (FET2a), the voltage of the prescribed level is supplied to the gate of the FET (FET2a) and the source of the FET (FET2a) is connected to one end of the resistance element R1a. The FETs (FET1a) and (FET2a) may instead be MOSFETs or high-electron-mobility transistors (HEMTs). The same is also true for FETs described hereafter.

The collector of the transistor Tr4a is connected to the other end of the resistance element R1a, the base of the transistor Tr4a is connected to the base of the transistor Tr2a, and the emitter of the transistor Tr4a is connected to ground. The bias circuit 130B outputs the bias current Ibias1 from a connection point between the resistance element R1a and the collector of the transistor Tr4a.

Compared with the bias circuit 132A illustrated in FIG. 2, the bias circuit 132B further includes a transistor Tr4b. The collector of the transistor Tr4b is connected to the other end of the resistance element R1b, the base of the transistor Tr4b is connected to the base of the transistor Tr2b, and the emitter of the transistor Tr4a is connected to ground. Thus, the bias circuit 132B outputs the bias current Ibias2 from a connection point between the resistance element R1b and the collector of the transistor Tr4b.

With this configuration as well, similarly to the power amplification circuit 100A, the power amplification circuit 100B can change the ratio at which the bias currents Ibias1 and Ibias2 are supplied and can adjust the output characteristic of the amplifier. In addition, when a larger bias current is needed in response to an increase in the output power of the RF signal, the bias circuits 130B and 132B can distribute currents that have flowed to the transistors Tr4a and Tr4b in advance to the base of the transistor 110. Thus, degradation of gain characteristics that is caused by there being an insufficient bias current, particularly at time of a large signal input, can be suppressed, and the generated amount of distortion brought about by such degradation of gain characteristics can be reduced.

Figure 5:
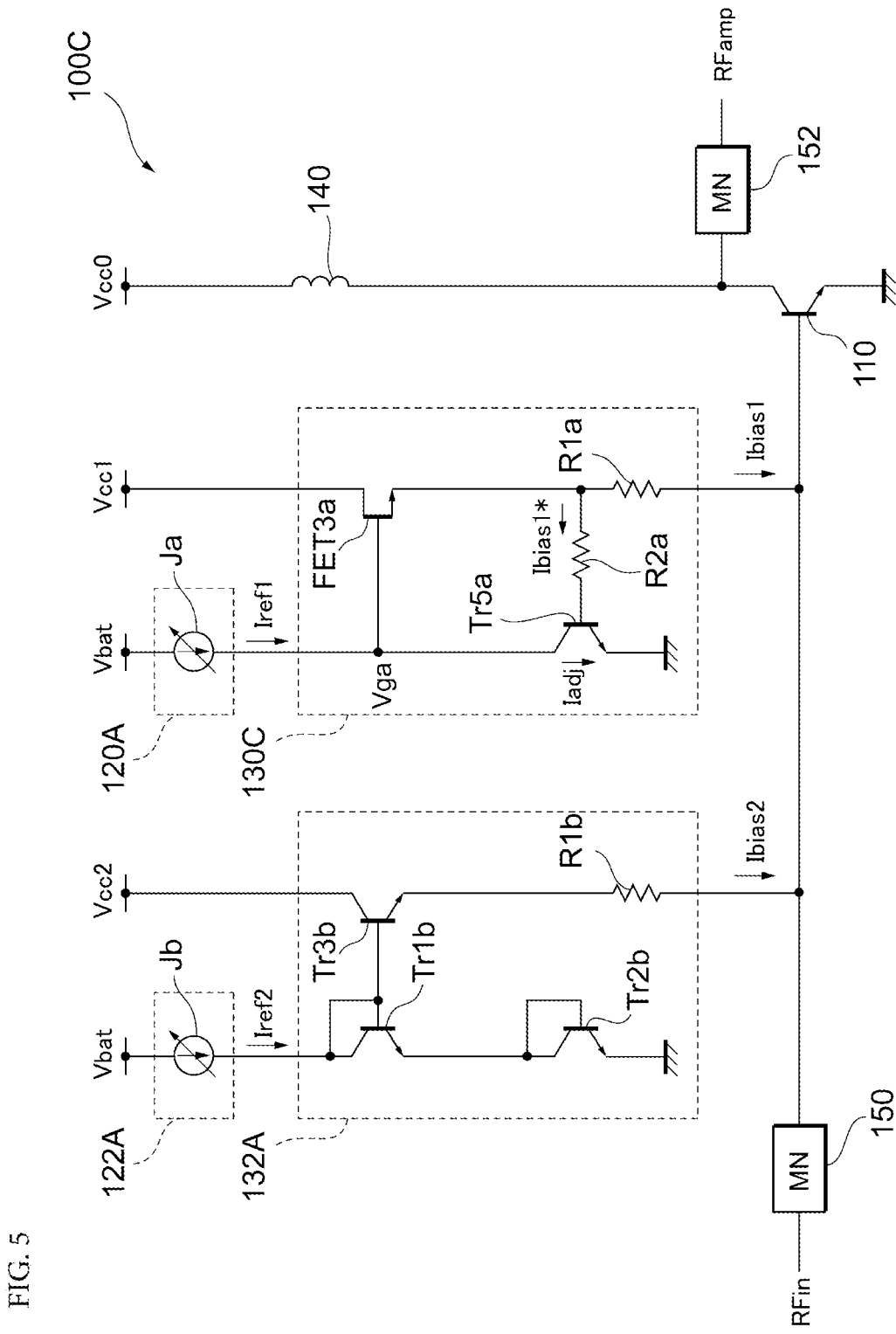
FIG. 5 illustrates an example configuration of a power amplification circuit according to a second embodiment of the present disclosure.

FIG. 5 illustrates an example configuration (power amplification circuit 100C) of a power amplification circuit 100 according to a second embodiment of the present disclosure. The power amplification circuit 100C includes a bias circuit 130C instead of the bias circuit 130A illustrated in FIG. 2.

The bias circuit 130C includes an FET (FET3a), a transistor Tr5a and resistance elements R1a and R2a.

The power supply voltage Vcc1 is supplied to the drain of the FET (FET3a) (first transistor), the gate of the FET (FET3a) is connected to an output terminal of the control circuit 120A and to the collector of the transistor Tr5a, and the source of the FET (FET3a) is connected to one end of each of the resistance elements R1a and R2a. A voltage that corresponds to a current Iadj that flows through the transistor Tr5a is supplied to the gate of the FET (FET3a). Thus, a current that corresponds to the gate-source voltage is output from the source of the FET (FET3a). This current is divided into the bias current Ibias1 that is supplied to the base of the transistor 110 and a bias current Ibias1* that is supplied to the base of the transistor Tr5a in accordance with the resistance values of the resistance elements R1a and R2a.

The reference current Iref1 is supplied to the collector of the transistor Tr5a (third transistor or first bipolar transistor), the base of the transistor Tr5a is connected to the other end of the resistance element R2a, and the emitter of the transistor Tr5a is connected to ground. The bias current Ibias1* is supplied to the base of the transistor Tr5a via the resistance element R2a.

One end of the resistance element R1a is connected to the source of the FET (FET3a) and the other end of the resistance element R1a is connected to the base of the transistor 110. One end of the resistance element R2a is connected to the source of the FET (FET3a) and the other end of the resistance element R2a is connected to the base of the transistor Tr5a. The resistance elements R1a and R2a adjust the distribution of the bias currents Ibias1 and Ibias1*.

In the bias circuit 130C, the bias currents Ibias1 and Ibias1* are supplied by the FET (FET3a) to the transistor 110 and the transistor Tr5a using the same configuration. Here, a current Iadj, which is proportional to the bias current Ibias1*, flows through the transistor Tr5a.

Furthermore, negative feedback is applied to the gate voltage Vga of the FET (FET3a) in order that the current Iadj and the reference current Iref1 supplied from the control circuit 120A have substantially the same size. For example, in the case where the size of the bias current Ibias1 has increased, the source voltage of the FET (FET3a) decreases due to a voltage drop across the resistance element R1a. Therefore, the size of the current Iadj that flows through the transistor Tr5a decreases as a result of the base voltage decreasing. However, since the transistor Tr5a operates such that a current having the same size as the reference current Iref1 (control current) flows therethrough, the current flowing through the transistor Tr5a is restricted by the reference current Iref1. Thus, a decrease in the collector voltage of the transistor Tr5a (=gate voltage Vga of FET (FET3a)) is suppressed, and therefore the amount of current flowing through the FET (FET3a) is stable. With the above-described configuration, even when the bias current Ibias1 varies with the supply of the input signal RFin, the bias current Ibias1* also fluctuates along with this variation and the operation point is stabilized.

With this configuration as well, similarly to the power amplification circuit 100A, the power amplification circuit 100C can change the supply ratio of the bias currents Ibias1 and Ibias2 and can adjust the output characteristic of the amplifier.

Figure 6:
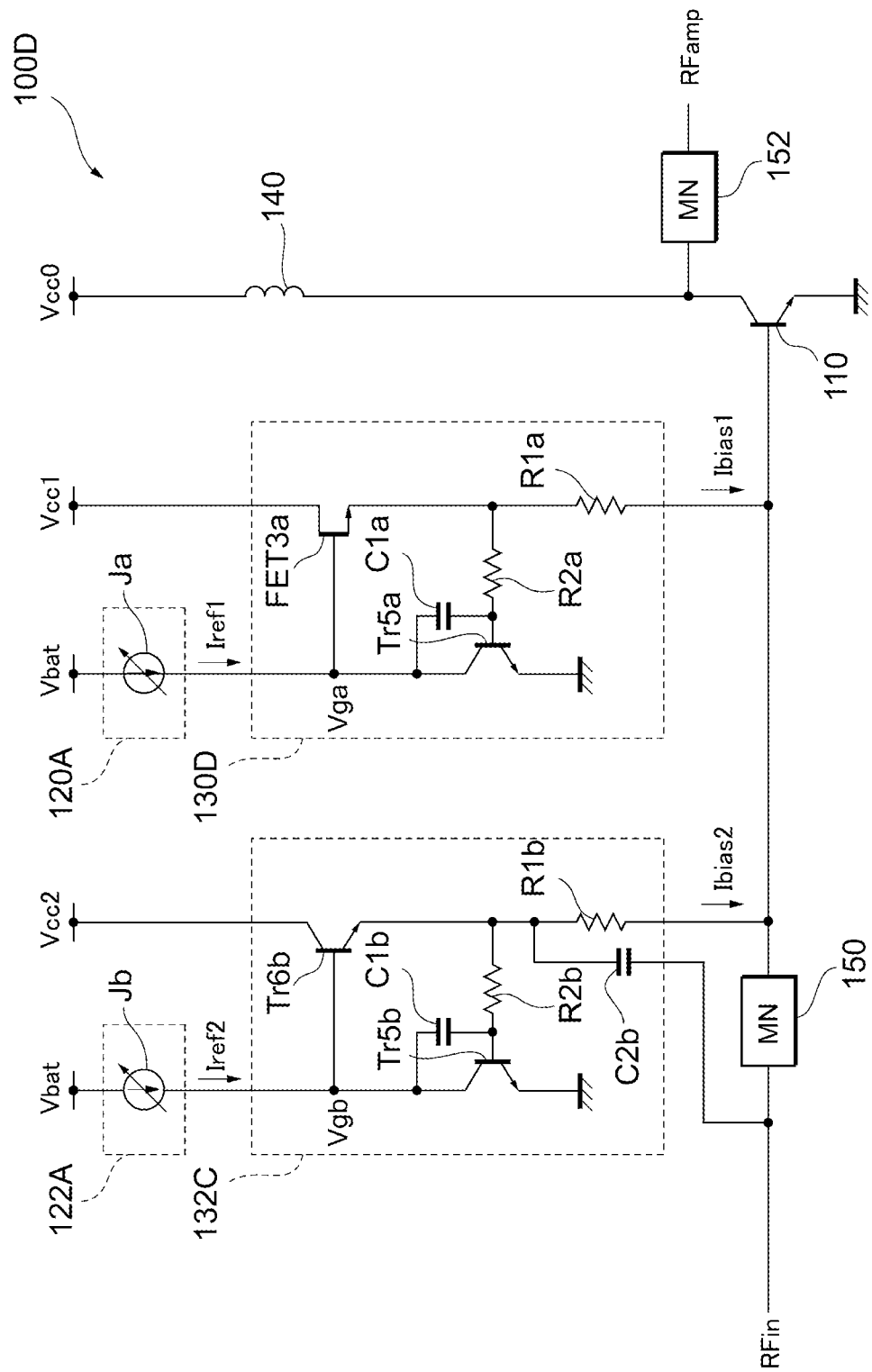
FIG. 6 illustrates an example configuration of a power amplification circuit according to a modification of the second embodiment of the present disclosure.

FIG. 6 illustrates an example configuration (power amplification circuit 100D) of a power amplification circuit 100 according to a modification of the second embodiment of the present disclosure. The power amplification circuit 100D includes bias circuits 130D and 132C instead of the bias circuits 130C and 132A illustrated in FIG. 5.

In addition to the configuration of the bias circuit 130C illustrated in FIG. 5, the bias circuit 130D further includes a capacitor C1a.

One end of the capacitor C1a is connected to the collector of the transistor Tr5a and the other end of the capacitor C1a is connected to the base of the transistor Tr5a.

If the bias circuit 130D were not provided with the capacitor C1a, the collector voltage of the transistor Tr5a would vary with the amplitude of an RF signal leaking to the base of the transistor Tr5a. Thus, the output terminal of the control circuit 120A would be affected by variations in the amplitude of the RF signal via the transistor Tr5a and the reference current Iref1 output by the control circuit 120A would vary. Specifically, for example, the control circuit 120A may be formed of a current source and a current-mirror-connected MOSFET and the reference current Iref1 may be output from the drain of the MOSFET. In such a case, the drain-source voltage of the MOSFET may decrease as the collector voltage of the transistor Tr5a increases and a reference current of a desired size may not be output.

However, the bias circuit 130D includes the capacitor C1a between the base and the collector of the transistor Tr5a. Here, Cbc represents the capacitance value of the capacitor C1a, gm represents the voltage gain of the transistor Tr5a, and Z represents the impedance on the control circuit 120A side seen from the collector of the transistor Tr5a. The capacitor C1a has a configuration that is equivalent to a capacitor that AC grounds the base of the transistor Tr5a with a capacitance value (1+gm×Z)×Cbc due to the mirror effect seen from the base of the transistor Tr5a. Therefore, variations in the base voltage of the transistor Tr5a that occur with variations in the amplitude of the RF signal are suppressed by this capacitor. Thus, variations in the collector voltage of the transistor Tr5a are also suppressed, and therefore the reference current Iref1 is stably supplied. Therefore, a bias current Ibias1 of a prescribed size is supplied even at the time of large signal input.

Compared with the configuration of the bias circuit 130D, the bias circuit 132C includes a transistor Tr6b instead of the FET (FET3a). In addition, the bias circuit 132C further includes a capacitor C2b.

A power supply voltage Vcc2 is supplied to the collector of the transistor Tr6b, the base of the transistor Tr6b is connected to an output terminal of the control circuit 122A and to the collector of a transistor Tr5b (fourth transistor), and the emitter of the transistor Tr6b is connected to one end of each of the resistance element R1b and R2b. Thus, the FET (FET3a) of the bias circuit 130D or the transistor Tr6b of the bias circuit 132C (in other words, a transistor that outputs a bias current) may be an FET or may be a bipolar transistor.

One end of the capacitor C2b is connected to the emitter of the transistor Tr6b and the input signal RFin is supplied to the other end of the capacitor C2b. The input signal RFin is supplied to the emitter of the transistor Tr6b via the capacitor C2b, and the emitter voltage of the transistor Tr6b varies in accordance with the amplitude of the input signal RFin. Thus, when the emitter voltage of the transistor Tr6b falls in accordance with the amplitude of the input signal at the time of a large input signal RFin, the transistor Tr6b turns on and an additional bias current Ibias2 is supplied to the base of the transistor 110.

With the above-described configuration, whether or not the bias current Ibias2 is supplied in the power amplification circuit 100D can be controlled in accordance with the input signal. Specifically, for example, a base voltage Vgb of the transistor Tr6b can be adjusted such that the transistor Tr6b is turned off at the time of a small input signal RFin and is turned on at the time of a large input signal RFin. Thus, the bias current Ibias2 is additionally supplied at the time of a large input signal RFin and the total bias current supplied to the base of the transistor 110 is increased.

With this configuration as well, similarly to the power amplification circuit 100A, the power amplification circuit 100D can change the ratio at which the bias currents Ibias1 and Ibias2 are supplied and can adjust the output characteristic of the amplifier. In addition, in the power amplification circuit 100D, variations in the collector voltages of the transistors Tr5a and Tr5b are suppressed in the bias circuits 130D and 132C, and therefore, variations in the reference currents Iref1 and Iref2 are also suppressed. Therefore, compared with the power amplification circuit 100C, the bias current can be more stably supplied.

Since the mirror effect is obtained, capacitors having comparatively small capacitance values can be used as the capacitors C1a and C1b. Thus, the capacitors C1a and C1b can be provided while suppressing an increase in the circuit area of the bias circuits. For example, the capacitance value of the capacitor C1a can be larger than the value of a parasitic capacitance between the gate and source of the FET (FET3a) and that the capacitance value of the capacitor C1b can be larger than the value of a parasitic capacitance between the base and emitter of the transistor Tr6b, and that the capacitance values can be of such a size that the transistors Tr5a and Tr5b suitably operate (for example, around 2 pF to 6 pF).

Figure 7:
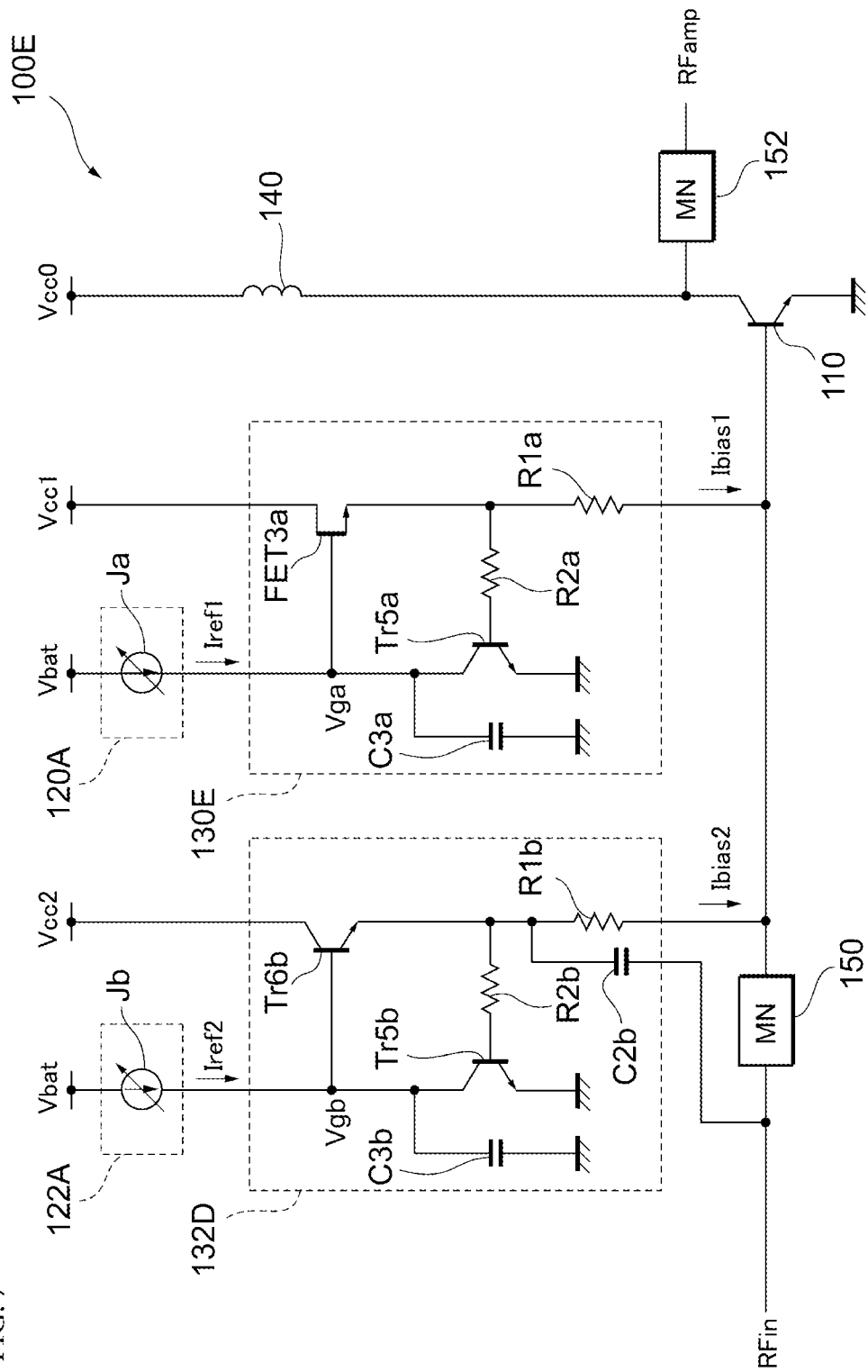
FIG. 7 illustrates an example configuration of a power amplification circuit according to another modification of the second embodiment of the present disclosure.

FIG. 7 illustrates an example configuration (power amplification circuit 100E) of a power amplification circuit 100 according to another modification of the second embodiment of the present disclosure. The power amplification circuit 100E includes bias circuits 130E and 132D instead of the bias circuits 130D and 132C illustrated in FIG. 6.

Compared with the bias circuits 130D and 132C illustrated in FIG. 6, the bias circuits 130E and 132D respectively include capacitors C3a and C3b instead of the capacitors C1a and C1b.

One end of the capacitor C3a is connected to the collector of the transistor Tr5a and the other end of the capacitor C3a is grounded. That is, the capacitor C3a AC grounds the collector of the transistor Tr5a. Thus, variations in the collector voltage of the transistor Tr5a caused by variations in the amplitude of the RF signal can be suppressed. Therefore, similarly to as in the power amplification circuit 100D, variations in the reference current Iref are suppressed and the bias current Ibias1 is stably supplied even at the time of large signal input. The capacitor C3b of the bias circuit 132D is similar to the capacitor C3a of the bias circuit 130E, and therefore detailed description thereof is omitted.

With this configuration as well, similarly to the power amplification circuit 100A, the power amplification circuit 100E can change the ratio at which the bias currents Ibias1 and Ibias2 are supplied and can adjust the output characteristic of the amplifier. In addition, similarly to the power amplification circuit 100D, the power amplification circuit 100E can stably supply the bias currents Ibias1 and Ibias2 regardless of the signal level of the input signal RFin.

Since the above-described mirror effect is not obtained, larger capacitance values are required for the capacitors C3a and C3b than for the capacitors C1a and C1b illustrated in FIG. 6. However, the capacitors C3a and C3b directly AC ground the collectors of the transistors Tr5a and Tr5b rather than the bases of the transistors Tr5a and Tr5b. Therefore, the bias circuits 130E and 132D are different from the bias circuits 130D and 132C, and are able to suppress variations in the collector voltages of the transistors Tr5a and Tr5b (that is, the gate voltage of the FET (FET3a) and the base voltage Vgb of the transistor Tr6b) without necessarily affecting the negative feedback performed using the transistors Tr5a and Tr5b. Thus, the bias circuits 130E and 132D can suppress variations in the reference currents Iref1 and Iref2 caused by variations in the amplitude of the input signal RFin while maintaining the function of adjusting the bias currents Ibias1 and Ibias2 through the negative feedback.

Figure 8:
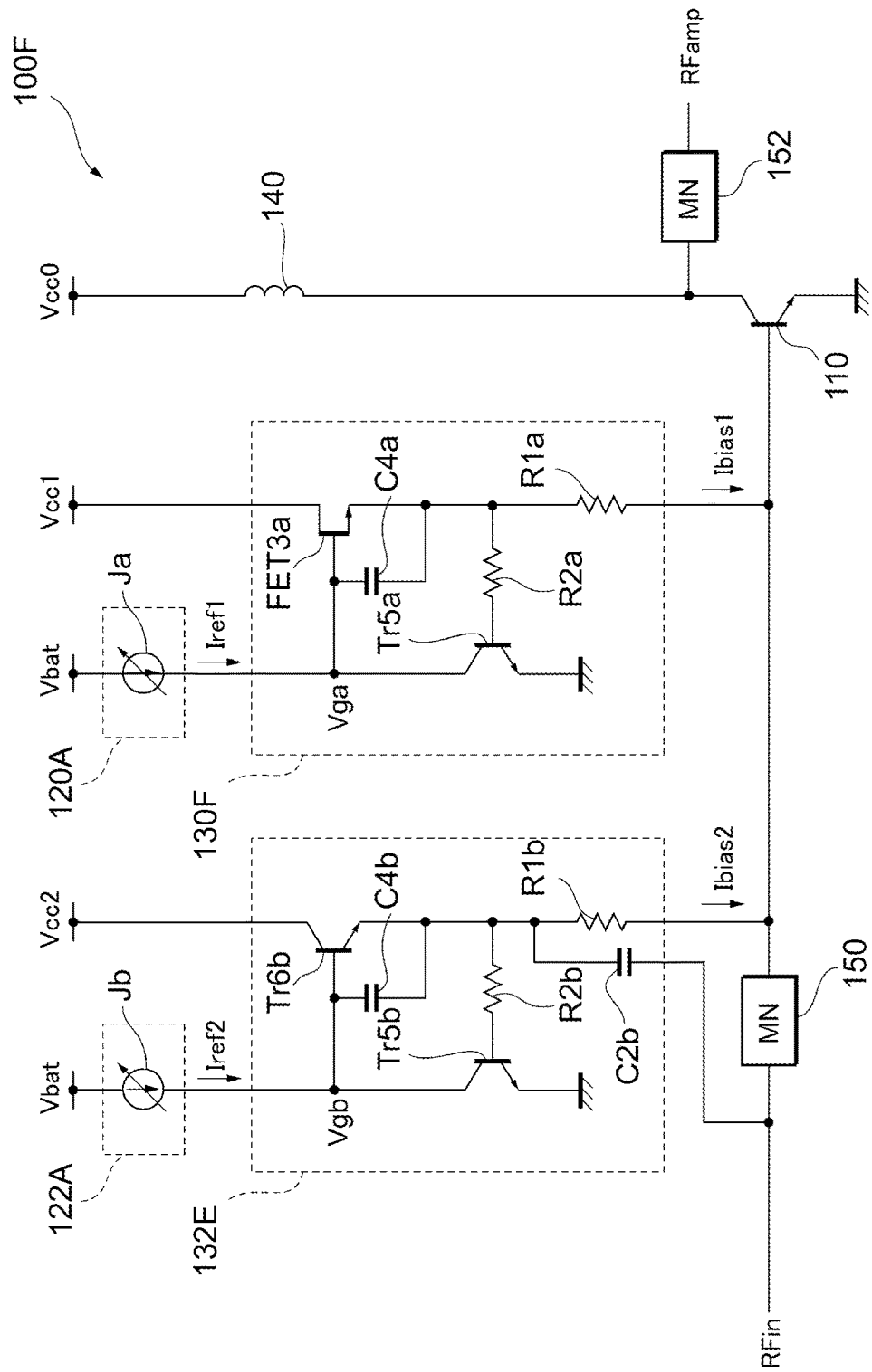
FIG. 8 illustrates an example configuration of a power amplification circuit according to another modification of the second embodiment of the present disclosure.

FIG. 8 illustrates an example configuration (power amplification circuit 100F) of a power amplification circuit 100 according to another modification of the second embodiment of the present disclosure. The power amplification circuit 100F includes bias circuits 130F and 132E instead of the bias circuits 130E and 132D illustrated in FIG. 7.

Compared with the bias circuits 130E and 132D illustrated in FIG. 7, the bias circuits 130F and 132E respectively include capacitors C4a and C4b instead of the capacitors C3a and C3b.

One end of the capacitor C4a is connected to the gate of the FET (FET3a) and the other end of the capacitor C4a is connected to the source of the FET (FET3a). Similarly to the capacitor C3a illustrated in FIG. 7, the capacitor C4a suppresses variations in the collector voltage of the transistor Tr5a (that is, the gate voltage Vga of the FET (FET3a)) that are caused by variations in the amplitude of the input signal RFin. The capacitor C4b of the bias circuit 132E is similar to the capacitor C4a of the bias circuit 130F, and therefore detailed description thereof is omitted.

With this configuration as well, similarly to the power amplification circuit 100A, the power amplification circuit 100F can change the ratio at which the bias currents Ibias1 and Ibias2 are supplied and can adjust the output characteristic of the amplifier. In addition, similarly to the power amplification circuit 100E, the power amplification circuit 100F can stably supply the bias currents Ibias1 and Ibias2 regardless of the signal level of the input signal RFin.

Figure 9:
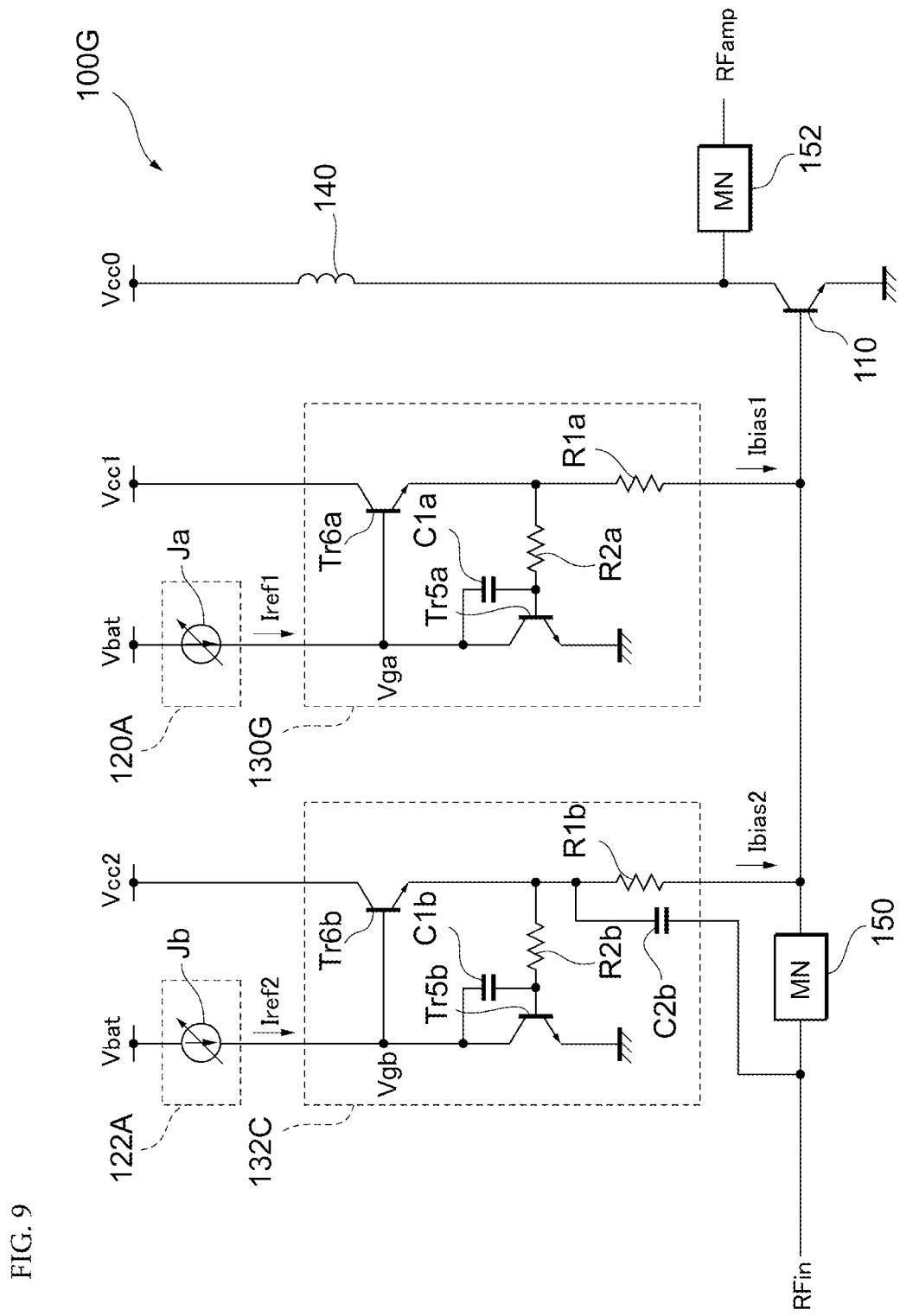
FIG. 9 illustrates an example configuration of a power amplification circuit according to another modification of the second embodiment of the present disclosure.

FIG. 9 illustrates an example configuration (power amplification circuit 100G) of a power amplification circuit 100 according to another modification of the second embodiment of the present disclosure. The power amplification circuit 100G includes a bias circuit 130G instead of the bias circuit 130D illustrated in FIG. 6.

Compared with the bias circuit 130D illustrated in FIG. 6, the bias circuit 130G includes a transistor Tr6a instead of the FET (FET3a). As described above, the FET (FET3a) in the bias circuit 130D may be formed of a bipolar transistor instead of a FET.

With this configuration as well, the power amplification circuit 100G can exhibit the same effect as the power amplification circuit 100D. Similarly to as in the power amplification circuit 100G, a bipolar transistor may be used instead of the FET (FET3a) in the bias circuits 130E and 130F of the power amplification circuits 100E and 100F illustrated in FIGS. 7 and 8 as well.

Exemplary embodiments of the present disclosure have been described above. The power amplification circuits 100, and 100A to 100G each include an amplifier, the bias circuits 130 and 132, and the control circuits 120 and 122 that control bias currents or voltages, and the current supplying capacity of the bias circuit 130 is different from the current supplying capacity of the bias circuit 132. Thus, the power amplification circuits can change the ratio at which the bias currents Ibias1 and Ibias2 are supplied and adjust the output characteristic of the amplifier.

In addition, in the power amplification circuit 100A, the bias circuits 130 and 132 include transistors Tr3a and Tr3b, and the element size of the transistor Tr3a may be different from the element size of the transistor Tr3b. As a result, the bias circuit 130 and the bias circuit 132 can be made to have different current supplying capacities. The bias circuits 130 and 132 are not limited to these configurations.

Furthermore, in the power amplification circuits 100A to 100G, the bias circuits 130 and 132 have the resistance elements R1a and R1b, and the resistance value of the resistance element R1a may be made to be different from the resistance value of the resistance element R1b. As a result, the bias circuit 130 and the bias circuit 132 can be made to have different current supplying capacities. The bias circuits 130 and 132 are not limited to these configurations.

Furthermore, as illustrated in FIGS. 5 to 9, the bias circuit 130 may further include the transistor Tr5a, and negative feedback may be implemented for the FET (FET3a) or the transistor Tr6a. The bias circuit 130 is not limited to this configuration.

As illustrated in FIGS. 6 to 9, the bias circuit 132 may further include the transistor Tr5b, and negative feedback may be implemented for the transistor Tr6b. The bias circuit 132 is not limited to this configuration.

Furthermore, the transistors that output the bias currents in the bias circuits 130 and 132 are not especially limited, and for example, one may be a FET and the other may be a bipolar transistor, or both may be bipolar transistors or both may be FETs.

The bias circuits 130D to 130G and 132C to 132E each have a configuration that includes one capacitor from among the capacitors C1a, C3a and C4a or C1b, C3b and C4b, but the bias circuits 130 and 132 are not limited to this configurations, and may instead include a plurality of capacitors from among the capacitors C1a, C3a and C4a or C1b, C3b and C4b.

Furthermore, in the case where the power amplification circuit is formed of a plurality of amplifier stages, the configurations of the bias circuits 130 and 132 may be applied to each amplifier stage.

The combinations of the configurations of the bias circuits 130 and 132 in the power amplification circuits 100A to 100G are merely illustrative examples, and the bias circuits 130 and 132 may be configured using different combinations. In the present specification, examples have been illustrated in which bias currents are supplied by two bias circuits, but the number of bias circuits is not limited to two and may be three or more.

The purpose of the embodiments described above is to enable easy understanding of the present invention and the embodiments are not to be interpreted as limiting the present invention. The present invention can be changed or improved without departing from the gist of the invention and equivalents to the present invention are also included in the scope of the present invention. In other words, appropriate design changes made to the embodiments by one skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present invention so long as the combined elements have the characteristics of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplification circuit comprising:
   an amplifier that amplifies an input signal and outputs an amplified signal;
   a first bias circuit that supplies a first bias current or voltage to the amplifier;
   a second bias circuit that supplies a second bias current or voltage to the amplifier;
   a first control circuit that outputs a first current that controls a level of the first bias current or voltage; and
   a second control circuit that outputs a second current that controls a level of the second bias current or voltage;
   wherein a current supplying capacity of the first bias circuit is different from a current supplying capacity of the second bias circuit,
   wherein the first bias circuit comprises a first transistor that outputs the first bias current or voltage in accordance with the first current,
   wherein the second bias circuit comprises a second transistor that outputs the second bias current or voltage in accordance with the second current, and comprises a fourth transistor, wherein a collector of the fourth transistor is connected to a base or gate of the second transistor, a base of the fourth transistor is connected to an emitter or source of the second transistor, an emitter of the fourth transistor is connected to ground, and the second current is supplied to the collector of the fourth transistor, and
   wherein a size of the first transistor is different from a size of the second transistor.

2. The power amplification circuit according to claim 1, wherein the first bias circuit further comprises a first resistance element that is connected in series between an emitter or source of the first transistor and the amplifier,
   the second bias circuit further comprises a second resistance element that is connected in series between an emitter or source of the second transistor and the amplifier, and
   a resistance value of the first resistance element is different from a resistance value of the second resistance element.

3. The power amplification circuit according to claim 1, wherein the first bias circuit further comprises a third transistor, and
   a collector of the third transistor is connected to a base or gate of the first transistor, a base of the third transistor is connected to an emitter or source of the first transistor, an emitter of the third transistor is connected to ground, and the first current is supplied to the collector of the third transistor.

4. The power amplification circuit according to claim 2, wherein the first bias circuit further comprises a third transistor, and
   a collector of the third transistor is connected to a base or gate of the first transistor, a base of the third transistor is connected to an emitter or source of the first transistor, an emitter of the third transistor is connected to ground, and the first current is supplied to the collector of the third transistor.

5. The power amplification circuit according to claim 1, wherein the first transistor is a field effect transistor (FET), and
   the second transistor is a bipolar transistor.

6. The power amplification circuit according to claim 2, wherein the first transistor is a field effect transistor (FET), and
   the second transistor is a bipolar transistor.

7. The power amplification circuit according to claim 3, wherein the first transistor is a field effect transistor (FET), and
   the second transistor is a bipolar transistor.

8. The power amplification circuit according to claim 4, wherein the first transistor is a field effect transistor (FET), and
   the second transistor is a bipolar transistor.

9. The power amplification circuit according to claim 1, wherein the first and second transistors are bipolar transistors.

10. The power amplification circuit according to claim 2, wherein the first and second transistors are bipolar transistors.

11. The power amplification circuit according to claim 3, wherein the first and second transistors are bipolar transistors.

12. The power amplification circuit according to claim 4, wherein the first and second transistors are bipolar transistors.

13. The power amplification circuit according to claim 1, wherein the first control circuit and the second control circuit each comprise a variable current source.

14. A power amplification circuit comprising:
    an amplifier that amplifies an input signal and outputs an amplified signal;
    a first bias circuit that supplies a first bias current or voltage to the amplifier in accordance with a first control current; and
    a second bias circuit that supplies a second bias current or voltage to the amplifier in accordance with a second control current;
    wherein the first bias circuit comprises:
    a first bipolar transistor, an emitter of the first bipolar transistor being connected to ground and a control current being supplied to a collector of the first bipolar transistor; and a field effect transistor (FET), a power supply voltage being supplied to a drain of the FET, a gate of the FET being connected to the collector of the first bipolar transistor, a source of the FET being connected to a base of the first bipolar transistor, and the first bias current or voltage being output from the source of the FET, the second bias circuit comprises:
   a second bipolar transistor, the power supply voltage being supplied to a collector of the second bipolar transistor, a control voltage being supplied to a base of the second bipolar transistor, and the second bias current or voltage being output from an emitter of the second bipolar transistor, and
   a fourth bipolar transistor, wherein a collector of the fourth bipolar transistor is connected to the base of the second bipolar transistor, a base of the fourth bipolar transistor is connected to the emitter of the second bipolar transistor, an emitter of the fourth bipolar transistor is connected to ground, and the second control current is supplied to the collector of the fourth bipolar transistor, a current supplying capacity of the first bias circuit is different from a current supplying capacity of the second bias circuit, and the size of the field effect transistor is different from a size of the second bipolar transistor.

* * * * *